United States Patent [19]

Doluca

[11] Patent Number: 5,554,874
[45] Date of Patent: Sep. 10, 1996

[54] SIX-TRANSISTOR SRAM CELL WITH WIDE BIT-LINE PITCH, DOUBLE WORDS LINES, AND BIT-LINE CONTACT SHARED AMONG FOUR CELLS

[75] Inventor: Sinan Doluca, Cupertino, Calif.

[73] Assignee: Quantum Effect Design, Inc., Santa Clara, Calif.

[21] Appl. No.: 461,019

[22] Filed: Jun. 5, 1995

[51] Int. Cl.$^6$ .............................. H01L 27/11; H01L 29/76
[52] U.S. Cl. ........................ 257/390; 257/401; 257/903; 257/904; 365/154; 365/156; 365/188
[58] Field of Search ................................. 257/903, 904, 257/390, 401; 365/154, 156, 188

[56] References Cited

U.S. PATENT DOCUMENTS

| | | | |
|---|---|---|---|
| 4,125,854 | 11/1978 | McKenney et al. | 357/41 |
| 4,393,474 | 7/1983 | McElroy | 365/200 |
| 5,124,774 | 6/1992 | Godinho et al. | 357/41 |
| 5,166,902 | 11/1992 | Silver | 365/182 |
| 5,198,683 | 3/1993 | Sivan | 257/67 |
| 5,264,385 | 11/1993 | Rodder | 437/52 |
| 5,338,963 | 8/1994 | Klaasen et al. | 257/376 |
| 5,349,552 | 9/1994 | Zampaglione | 365/51 |
| 5,354,704 | 10/1994 | Yang et al. | 437/52 |
| 5,461,251 | 10/1995 | Yang et al. | 257/903 |
| 5,474,948 | 12/1995 | Yamazaki | 257/904 |

*Primary Examiner*—Ngân V. Ngô
*Attorney, Agent, or Firm*—Stuart T. Auvinen

[57] ABSTRACT

A static RAM memory is arranged into groups of four cells sharing a single active region with a contact to one of the bit lines. The shared active region forms the sources of four access transistors. The group of four cells requires only one pair of bit lines instead of the usual two pairs of bit lines. Thus a pair of bit lines occurs for every two cells rather than for every cell. This increases the bit-line pitch and facilitates design and layout of the sense amps. Since only one of the four cells can drive the bit lines at any time, four word lines are used instead of only two. Each cell has two word lines crossing over it, and the cells in a row alternately connect to one or the other word line. Since word-line drivers and decoders are simpler and easier to lay out than the sense amps, the tighter word-line pitch is acceptable. An unused metal line occurs for every two columns of cells. The bit lines are shielded from this unused metal line by power and ground lines. Thus the shielded metal line is ideal for system interconnect through the RAM when the RAM is embedded in a larger system.

20 Claims, 11 Drawing Sheets

PRIOR ART
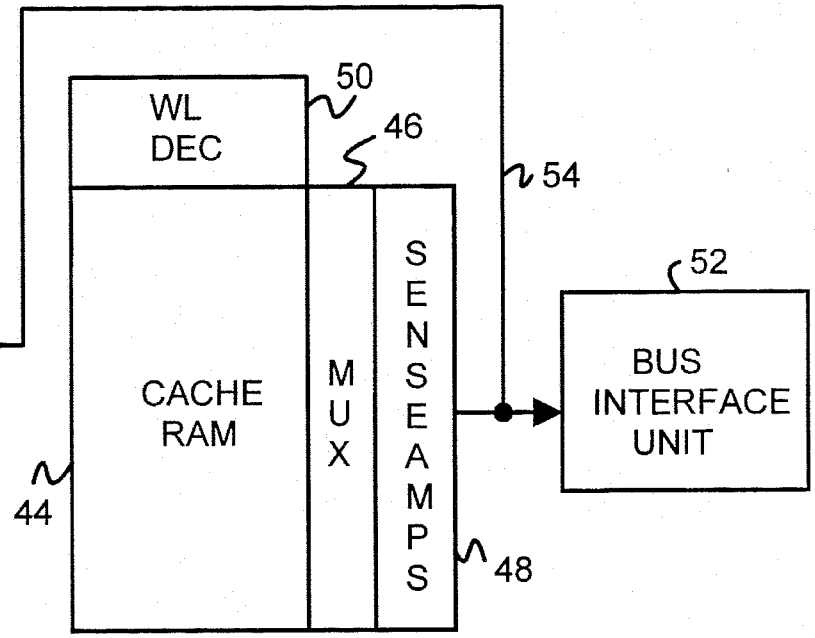
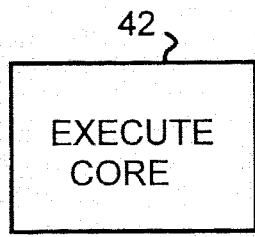
Fig. 4
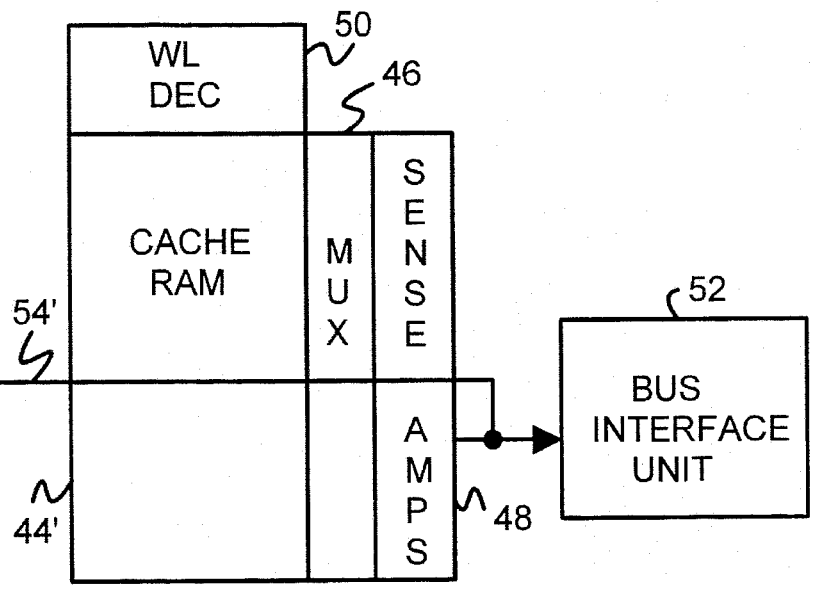
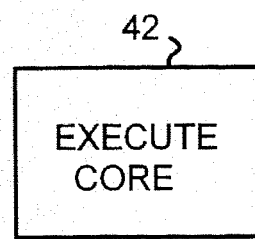
Fig. 11

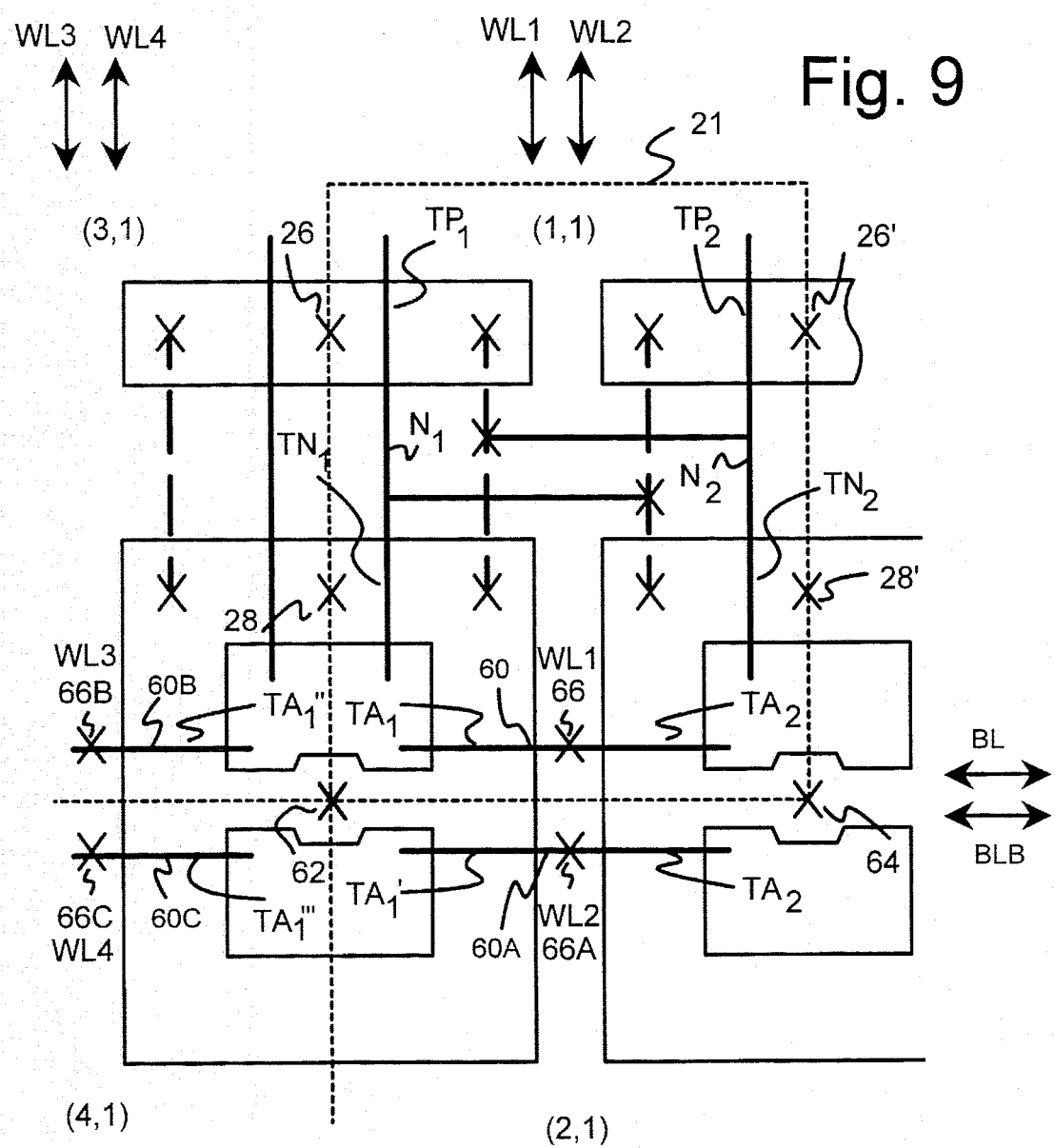

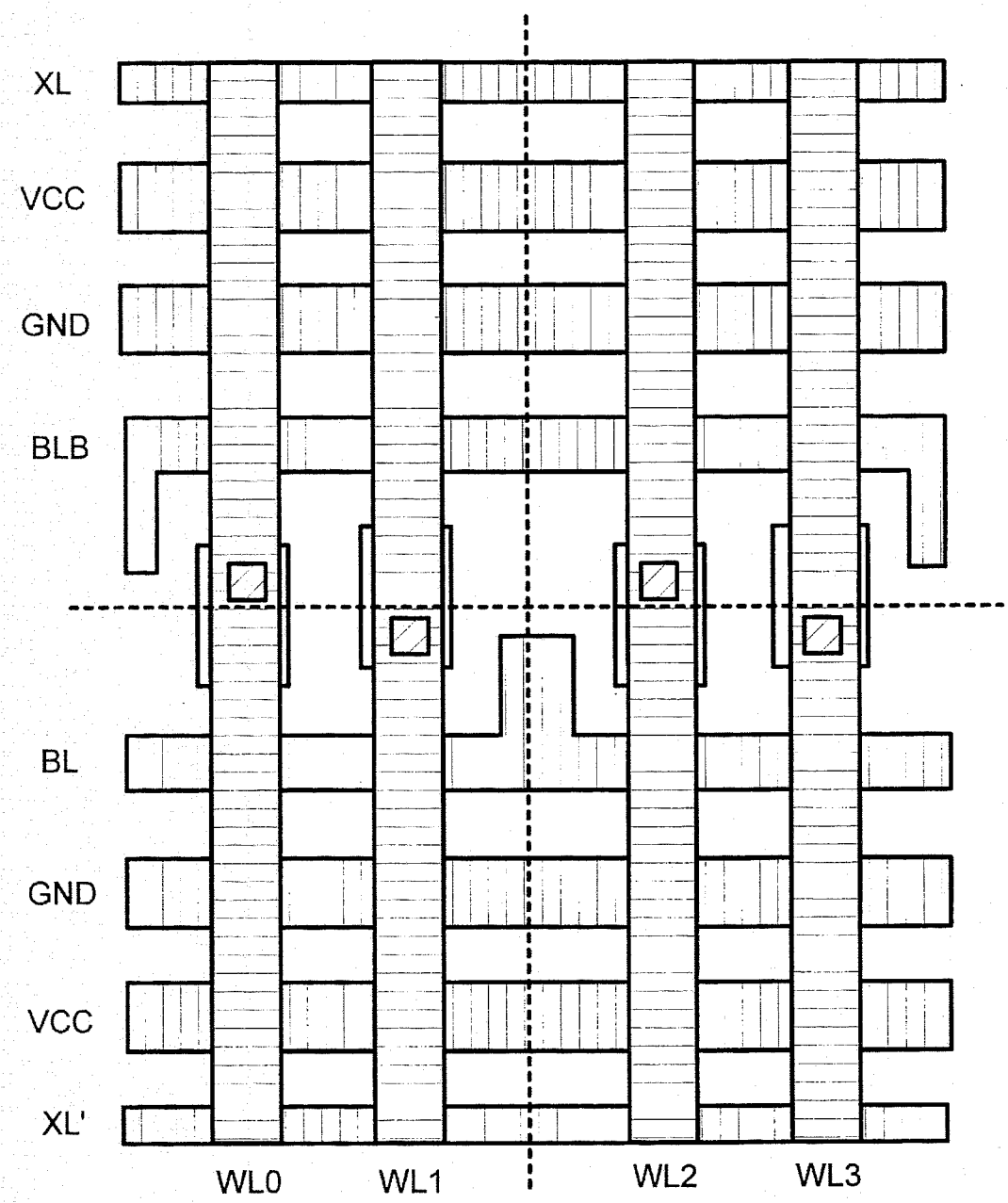
FIGURE 10C
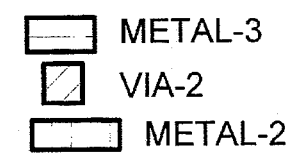

SIX-TRANSISTOR SRAM CELL WITH WIDE BIT-LINE PITCH, DOUBLE WORDS LINES, AND BIT-LINE CONTACT SHARED AMONG FOUR CELLS

BACKGROUND OF THE INVENTION

1. Field of the Invention

This invention relates to static random-access memories (SRAM), and more particularly to a SRAM cell and array layout.

2. Description of the Related Art

Static RAM memories are widely used as cache memories for central processing units (CPU's). Recently, cache RAM's have also been embedded on the processor die for microprocessor chips. Many have attempted and succeeded at reducing the size of the SRAM cell, and thus reducing the cost and speed delay of the memory.

FIG. 1 depicts a SRAM cell layout that is widely used. The physical layout of the six transistors in this cell 20 are shown as a stick diagram. The cell 20 contains a pair of cross-coupled inverters, each with a p-channel and an n-channel MOS transistor. These transistors are formed where polysilicon, shown as thick lines, cross active areas which are represented as rectangles or polygons. For example, one inverter comprises transistors $TP_1$ and $TN_1$, with transistor $TP_1$ formed when polysilicon line $N_1$ crosses over the p-channel active area containing contact 26 to Vdd, and transistor $TN_1$ formed when polysilicon line $N_1$ crosses over the n-channel active area containing contact 28 to ground. "X"es represents contacts between layers such as polysilicon, metal, or active silicon. The second inverter comprises transistors $TP_2$ and $TN_2$, with transistor $TP_2$ formed when polysilicon line $N_2$ crosses over the p-channel active area containing contact 26' to Vdd, and transistor $TN_2$ formed when polysilicon line $N_2$ crosses over the n-channel active area containing contact 28' to ground.

Two pass or access n-channel transistors $TA_1$ and $TA_2$ are provided to connect the cross-coupled inverters in cell 20 to a pair of bit lines BL, BLB. When these access transistors $TA_1$, $TA_2$ conduct, the cell may be read or written to using bit lines BL, BLB. Transistors $TA_1$ and $TA_2$ are formed when a polysilicon row or word line 30 crosses over the n-channel active areas, which are shared with the n-channel transistors $TN_1$ and $TN_2$. Polysilicon word line 30 may be 'strapped' every 8–64 cells in metal to reduce the resistance. Bit-line contacts 22, 24 connect to bit lines BL, BLB, which run in metal over cell 20 in a vertical direction as shown.

Prior-art cell 20 has bit lines running in a vertical or y-axis direction, while row lines run in a horizontal or x-axis direction. For a three-layer metal process, the first layer of metal is used for interconnect within the cell, for cross-coupling the two inverters, as shown by the dashed thick lines of FIG. 1. The bit lines run in second metal, while the polysilicon word lines are strapped with third-layer metal. It is common to reverse the roles of the second and third layer metals.

Bus Conflict Prevents Sharing Bit-Line Contacts in Word-Line Direction

Cell 20 may be reflected along the x-axis so that bit-line contacts 22, 24 are shared between two cells. Contacts to power (Vdd or Vcc) and ground may also be shared among two or four cells. However, bit-line contacts 22, 24 cannot simply be shared with cells to the right of left of cell 20, since these cells all use the same word line 30. A bus conflict would occur as two adjacent cells would have their access transistors $TA_1$, $TA_2$ activated by the same word line.

FIG. 2 is a schematic diagram of prior-art memory cell 20 in a small array. Prior-art memory cell 20 of FIG. 1 contains a pair of cross-coupled inverters which serve as the storage element of cell 20. Cell 20 also contains two access transistors which connect the cross-coupled inverters of cell 20 to true and complementary bit lines BL1, BL1B. These access transistors are gated by word line WL3. When word line WL3 is active and at a relatively high voltage, then access transistors in cell 20A to the right of cell 20 are also active. Cell 20 drives bit lines BL1, BL1B, while cell 20A drives bit lines BL2, BL2B. No bus conflict occurs since cell 20 drives a different pair of bit lines than cell 20A. Only one word line of word lines WL1, WL2, WL3, WL4 is active at any time. Cell 20B, directly below cell 20, may share bit-line contacts with cell 20, since cell 20 is accessed by word line WL3, while cell 20B below is accessed by a different word line, WL4. Cells 20A and 20C likewise share their bit-line contacts, as do other longitudinal pairs of memory cells.

Cell 20 may not share its bit-line contacts with cell 20A to its right, since both cells would be accessed at the same time by word line WL3, and a bus conflict would occur at the shared bit-line contact. Thus each bit line contact is shared among only two memory cells.

Each cell 20 has one word line and two bit lines connecting to it and passing through or over the cell. Memory cell 20 is rectangular, with its word-line pitch about 1.5 times larger than its bit-line pitch. This aspect ratio of about 1.5:1.0 constrains the design of circuitry which interfaces with cell 20 in an array. Especially in the smaller (bit-line) dimension is design of bit-line interface circuitry problematic.

Small Bit-Line Pitch Requires Mux to Sense Amps

FIG. 3 shows a prior-art memory array which requires muxing to the sense amps because of the small bit-line pitch. Cell 20 of FIGS. 1, 2 is arrayed in the x and y directions to form cache array 44. Word-line decoder-drivers 50 decode an input address and select one word line in array 44. Word-line decoder-drivers 50 are relatively simple to design as the decode function may be shared among several word lines, allowing each word-line driver to fit within the word-line pitch when physically laid out. However, sense amps 48 for high-speed SRAMs are relatively complex, typically requiring ten to twenty transistors for each sense amplifier. These transistors are typically large in size to achieve a high speed when sensing a small current from the small memory cell. Thus each bit's sense amplifier may not fit within the bit-line pitch of cell 20.

The prior-art solution to the tight bit-line pitch is to multiplex several columns of cells in array 44 to a single sense amplifier. Thus if four columns are muxed to one sense amplifier, the sense amplifier has to fit in four bit-line pitches rather than just one bit-line pitch.

FIG. 3 shows a simple scheme where four columns, each having a width of one cell's bit-line pitch, are muxed onto one pair of data lines 56 and share one sense amplifier 48. Mux 46 contains one pair of MOS transistors for each column, which are selected by select signals SEL0:3, which may be generated by decoding of address inputs. Mux 46 selects one column's bit-line pair for coupling to data lines 56 and sensing by sense amp 48.

Mux Slows Down Reading Memory & Adds Complexity

Mux 46 slows the reading speed of memory cells in array 44, as the read current from a memory cell in array 44 must pass through an extra MOS transistor in mux 46. This extra MOS transistor acts as a resistor, slowing the read. Data lines 56 may be long in length, adding a further capacitive delay to the read. Thus mux 46 is undesirable as it adds complexity to the memory and slows down the read. However, mux 46 may be necessary when the cell's bit-line pitch is too small to allow one sense amp 48 to be physically located beneath a single column of memory cells.

Interconnect a Problem with Embedded RAM

When memory array 44 is embedded in a larger system such as a microprocessor, it often occupies a large area on the silicon die. Since the tight layout of memory cell 20 in array 44 does not allow for additional metal lines to be routed over cell 20 in the bit line direction, interconnect lines must bypass memory array 44, and possibly its interface circuits as well. FIG. 4 shows that long interconnect bypasses around a prior-art embedded RAM are needed. For example, array 44 may be used as a cache RAM which is located between the CPU's execution core 42 which executes instructions, and a bus interface unit (BIU) 52 which fetches additional data or instructions from an external memory.

The data read out of array 44 is available at the outputs of sense amplifier 48. Sense amplifier 48 is located close to BIU 52, but far away from execution core 42. Since both BIU 52 and execution core 42 receive data from cache memory array 44, a long interconnect bus 54 must be routed from the RAM data output at sense amplifier 48 to execution core 42. Interconnect bus 54 is long since it cannot be routed through array 44 without expanding the bit-line pitch. Reversing or rotating array 44 will only reduce the length of interconnect bus 54 to execution core 42 at the expense of increasing the length of interconnect to BIU 52.

Even if interconnect signals could be routed through array 44, capacitive coupling could occur between the word or bit lines and the interconnect lines. This capacitive coupling could cause false data to be read from array 44. The false data might only occur for certain data patterns in array 44, and thus be very hard to detect or reproduce. The long length that the interconnect signal would run adjacent to a bit or word line greatly increases the capacitance between the lines. Thus the interconnect line needs to be shielded from the bit and word lines. Simply enlarging the memory cell does not provide shielding, and when the interconnect bus is a 64-bit data bus, as many as 64 columns or rows of cells would have to be expanded, significantly increasing the area.

What is desired is a memory cell for a static RAM that is sized to better interface with sense amplifiers. It is desired to provide at least one shielded metal line in the memory cell which can be used for interconnect. This shielded metal line is to be used for signals unrelated to the memory, such as interconnect signals in a processor with an embedded RAM. It is desired to increase the pitch of the bit-lines in a memory cell without significantly increasing the size of the memory cell, to allow the layout of sense amplifiers in the bit-line pitch. It is also desired to increase the sharing of contacts among adjacent memory cells, and in particular it is desired to share the bit-line contact among four adjacent cells rather than just two adjacent cells.

SUMMARY OF THE INVENTION

A static RAM memory is arranged into groups of four cells sharing a single active region with a contact to one of the bit lines. The shared active region forms the sources of four access transistors. The group of four cells requires only one pair of bit lines instead of the usual two pairs of bit lines. Thus a pair of bit lines occurs for every two cells rather than for every cell. This has the advantage of increasing the bit-line pitch and facilitates design and layout of the critical sense amps. Since only one of the four cells can drive the bit lines at any time, four word lines are used instead of only two. Each cell has two word lines crossing over it, and the cells in a row alternately connect to one or the other word line.

An integrated circuit static RAM memory has a substrate of semiconductor material of a first conductivity type. An array of memory cells is fabricated in the substrate, and the cells are arranged in rows and columns. Each memory cell in the array of memory cells has a cross-coupled pair of inverters for storing one bit of data. A first inverter has a first n-channel pull-down transistor and a second inverter has a second n-channel pull-down transistor. Each n-channel transistor has a drain diffusion and a gate.

A first access transistor has a drain diffusion electrically coupled to the drain diffusion of the first n-channel pull-down transistor. It is electrically coupled to the gate of the second n-channel pull-down transistor of the cross-coupled pair of inverters. The first access transistor has a source diffusion and a gate. A second access transistor has a drain diffusion that is electrically coupled to the drain diffusion of the second n-channel pull-down transistor and is electrically coupled to the gate of the first n-channel pull-down transistor of the cross-coupled pair of inverters. This second access transistor also has a source diffusion and a gate.

The drain diffusion of the first access transistor is formed in common with the drain diffusion of the first n-channel pull-down transistor. Also, the drain diffusion of the second access transistor is formed in common with the drain diffusion of the second n-channel pull-down transistor. The array has a group of four cells of the memory cells disposed in a mutually contiguous relation to each other in a first row and in a second row adjacent to the first row, and in a first column and in a second column adjacent to the first column.

The source diffusions of the first access transistors of each cell in the group of four cells is formed in common in a common diffusion area. The first access transistors of the group of four cells are electrically and physically connected to each other by the common diffusion area and not by a metal layer. Thus the first access transistor in each cell in the group of four cells shares the common diffusion area.

In other aspects of the invention a bit line crosses the group of four cells in a second metal layer. The bit line electrically connects to the source diffusions of the first access transistors through a single metal-to-silicon contact from the second metal layer to the common diffusion area. Only one contact from the bit line to the common diffusion area electrically connects the bit line to four access transistors in four cells.

This common diffusion area is disposed substantially in a geometric center of the group of four cells, according to another aspect of the invention.

Two word lines cross over each cell in each row of cells in the array. Each row of cells has even cells alternating with odd cells. A first word line connects to the gates of the first and second access transistors for even cells while a second word line connects to the gates of the first and second access transistors for odd cells.

In further aspects of the invention a local polysilicon line forms the gates of the first and second access transistors in the cell. This local polysilicon line is connected to other cells only by metal and not by polysilicon. This local polysilicon line not electrically connected to any adjacent cell. The first and second word lines cross over each cell in a third metal layer, and each even cell has a contact from the first word line in third metal layer to the local polysilicon line, while each odd cell has a contact from the second word line in third metal layer to the local polysilicon line.

BRIEF DESCRIPTION OF THE DRAWINGS

FIG. 4 shows long interconnect by-passes around a prior-art embedded RAM.

FIG. 9 highlights how the bit-line contact is shared among four cells, and that different local polysilicon lines are needed for each cell.

FIGS. 10A, 10B, 10C show the actual layout of four SRAM memory cells with the 4-way shared bit-line contacts for a 1.0 µm CMOS process.

FIG. 11 shows an embedded SRAM with extra shielded signal lines that are used for system-level wiring or interconnect.

DETAILED DESCRIPTION

The present invention relates to an improvement in static RAM memory cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5:
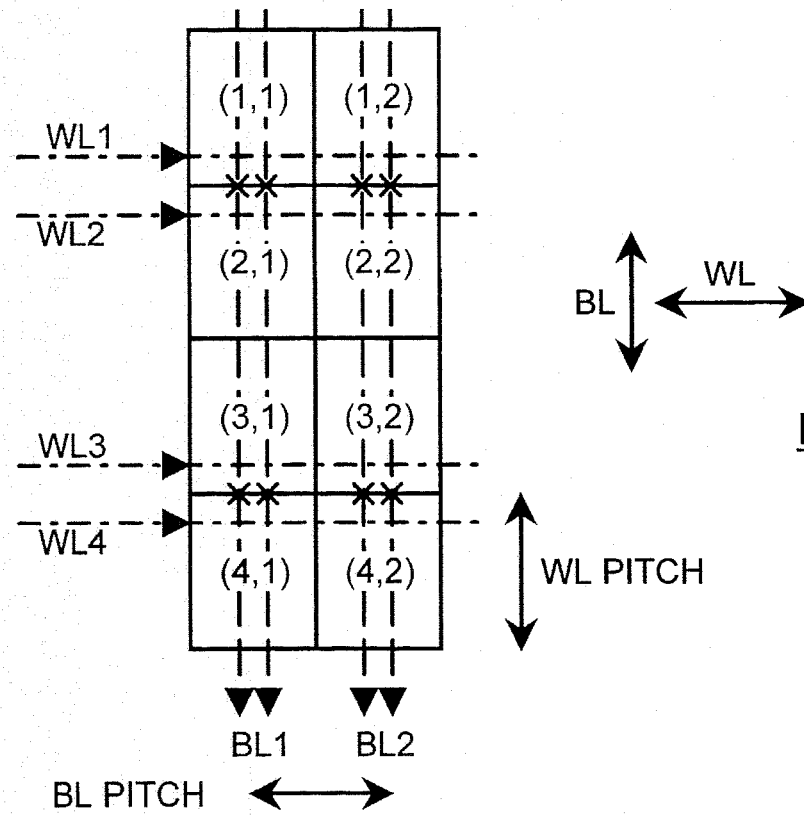
FIG. 5 is a diagram of a layout of eight prior-art SRAM cells.
Figure 6:
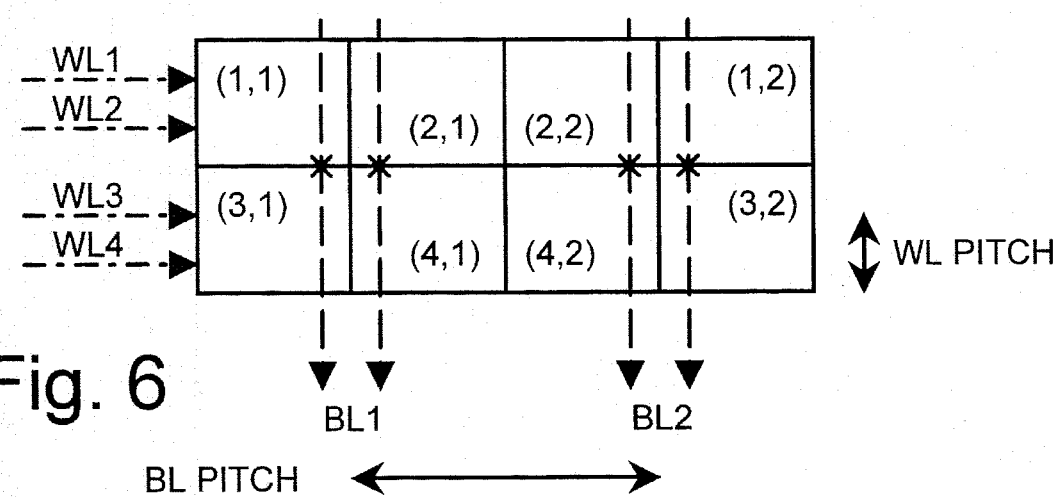
FIG. 6 shows that the memory cells of the present invention have a wide bit-line pitch which facilitates layout of sense amplifiers.

FIGS. 5 and 6 contrast the layout and arrangement in an array of prior-art SRAM cells with the SRAM cell of the present invention.

FIG. 5 is a diagram of a layout of eight prior-art SRAM cells. One word line and two bit lines (one bit-line pair) cross and connect to each cell. For example, cell (2,1) is accessed by word-line WL2 and drives bit-line pair BL1, while cell (3,2) is accessed by word-line WL3 and drives bit-line pair BL2. Two adjacent cells share a pair of bit-line contacts, which are shown as "X"es at the edge of the cell where the bit-lines cross into the cell. Thus cells (3,1) and (4,1) share contacts to bit-line pair BL1, while cells (3,2), (4,2) share contacts to bit-line pair BL2. The bit-line pitch is smaller than the word-line pitch since the cells tend to be taller than they are wide. This makes layout of the sense amplifiers under a column of cells difficult or impossible.

In contrast, FIG. 6 shows that the memory cells of the present invention have a wide bit-line pitch which facilitates layout of sense amplifiers. Bit-line contacts are shared among four adjacent cells rather than two adjacent cells. For example, bit-line contacts (marked "X") for bit-line pair BL1 are shared among four cells (1,1), (2,1), (3,1), and (4,1). Likewise contacts to bit-line pair BL2 are shared among four cells (1,2), (2,2), (3,2), and (4,2). The total number of bit-line contacts for eight cells is only four contacts for FIG. 6, while double the number of contacts, eight contacts, are needed for the eight prior-art cells of FIG. 5. Thus the invention has reduced the number of bit-line contacts by half.

For clarity FIG. 6 shows the bit-line contacts in the center of the four cells for both true and complementary bit-lines. However, the contacts to the complementary bit-line of each bit-line pair is actually made at the upper edge of cells (1,1), (2,1) and (1,2), (2,2) and the lower edge of cells (3,1), (4,1) and (3,2), (4,2). Since these upper and lower edges abut to other groups of four cells, the contacts to the complementary bit lines are also shared among four cells. Thus the contacts to the true and complementary bits lines are made at alternate edges of cell pairs in a staggered fashion, but each contact is shared among four cells.

One Bit-Line Pair for Every Two Columns

One bit-line pair is required for every two columns of cells rather than for each column of cells as in prior-art FIG. 5. Thus bit-line pair BL1 connects to two columns of cells, a first column containing cells (1,1), (3,1), and a second column having cells (2,1), (4,1). However, two word lines cross each cell. The ease of layout of the word-line decoder-drivers makes it feasible to drive two word-lines into each row of cells, even when the cell's y-pitch is the smaller pitch.

The interior of the prior-art memory cell is substantially rotated by ninety degrees so that the smaller pitch is now the word-line pitch rather than the bit-line pitch. The invention increases the bit-line pitch by about 50% by rotating the memory cell.

However, the increased bit-line pitch is then doubled by the sharing of the bit-line contacts among four rather than just two adjacent cells. Thus the invention is able to increase the bit-line pitch by about a factor of three (3×). The cell size smaller by 5 to 10% due to bit-line contacts shared among four adjacent cells. Physical layout is simplified since sense amplifier layout is more difficult than wo17rd-line driver layout, as sense amplifiers require cross-coupling for amplifier feedback and several relatively large sensing transistors.

Two Word Lines per Row of Cells

Bus conflicts are avoided by providing two word lines per row of cells, rather than just one word line for each row of cells. Thus the pair of word lines selects alternate columns of memory cells. Since only one of every two columns of memory cells is selected by the pair of row lines, two cells never drive the same bit lines, and thus the bus conflict is avoided.

Word line WL1 selects cells (1,1) and (1,2) for connection to bit-line pairs BL1, BL2 respectively, while word line WL2 selects cells (2,1) and (2,2) for connection to bit-line pairs BL1, BL2 respectively. Since only one of the word lines WL1, WL2, WL3, WL4 is selected and active at any one time, only one of the four cells sharing the bit-line contacts has its word line active and is connected to the bit-line pair. For example, when word line WL2 is active, cell (2,1) is connected to bit-line pair BL1, while cell (2,2) is connected to bit-line pair BL2. Likewise when word line WL3 is active, cell (3,1) is connected to bit-line pair BL1, while cell (3,2) is connected to bit-line pair BL2.

Providing two word lines per row of cells reduces the word-line pitch by half. Fortunately, the additional decode logic for a second word line is minimal. The word-line driver can be a simple inverter, while the decoding logic may only need one extra NAND gate. Indeed, the extra NAND gate may itself be shared with another NAND gate by using a few extra transistors in the NAND gate, or the extra NAND gate may be avoided by using a 2-input NOR gate as the driver instead of an inverter. Thus providing two word lines per row instead of one word line per row is possible with just a small number of additional transistors.

CELL WITH 4-WAY SHARED BIT-LINE CONTACT—FIG. 7

Figure 7:
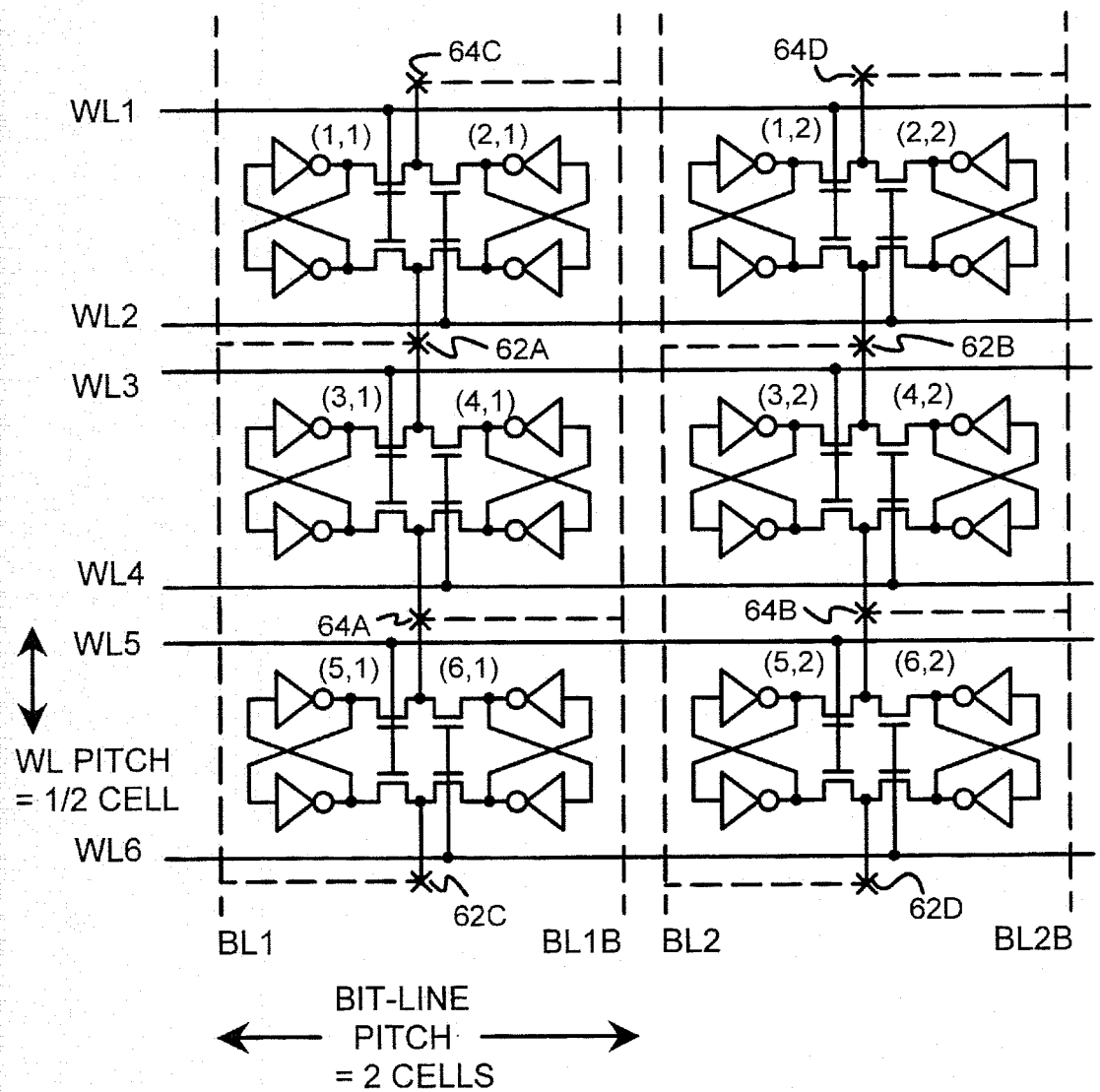
FIG. 7 is a schematic diagram of an array of SRAM memory cells emphasizing how four adjacent memory cells share the bit-line contacts.

FIG. 7 is a schematic diagram of an array of SRAM memory cells emphasizing how four adjacent memory cells share the bit-line contacts. Each cell contains a pair of cross-coupled inverters storing a bit of data. Two n-channel access transistors connect the cross-coupled inverters in the cell to a pair of bit lines. These two n-channel access transistors have their gates controlled by one of the word lines WL1, WL2, WL3, WL4, WL5, WL6. Since there are only three rows of cells, alternate cells are controlled by alternate word lines. Thus the first row of cells have access transistors that are alternately controlled by word lines WL1, WL2. For the first row, cells (1,1) and (1,2) are controlled by word line WL1, while cells (2,1) and (2,2) are controlled by word line WL2.

Each pair of bit lines connects with two columns of cells. Only one cell in the two columns is selected, as each column has a different word line which selects the column. Thus when word line WL1 is active, cell (1,1) drives the first bit-line pair BL1, BL1B, while cell (1,2) drives the second bit-line pair BL2, BL2B. Since all of the other word lines are inactive, such as by being driven to a low voltage or ground, none of the other cells drive the bit lines. No bus conflicts occur.

Each bit-line pair has two bit lines: a true bit line (BL1, BL2) and a complement bit line (BL1B, BL2B). These bit-line pairs contain complementary data in the sense that one bit line is driven to a lower voltage while the other bit line remains at a higher voltage than the other bit line when a cell is read or written. The difference in voltages on the pair of bit lines may be slight since a very small difference in voltage may be sensed by a sense amplifier.

4-Way Shared Bit-Line Contacts

The Bit-lines are shown as dashed lines in FIG. 7. These dashed lines are metal lines running generally in a vertical or y direction as shown in this figure. Bit-line contacts are made from these bit-lines to active areas of the access transistors, the source/drain regions of the access transistors. These bit-line contacts from metal to active are shown as "X" es. Each single bit-line contact connects to the sources or drains of four access transistors in four adjacent cells. Thus bit-line contact 62A connects bit line BL1 to cells (1,1), (2,1), (3,1), and (4,1). For complementary bit line BL1B, bit-line contact 64A connects bit line BL1B to cells (3,1), (4,1), (5,1), and (6,1). Cells (1,1), and (2,1) are connected to bit line BL1B through a different bit-line contact, 64C, than for cells (3,1), (4,1) which use contact 64A. Although each bit-line contact connects to four cells, the bit-line contacts for the true and complement bit lines connect to a different group of four cells.

For each pair of columns of cells, the bit-line contacts alternately connect to the true and complement bit lines. Each cell connects to one of the bit lines at an upper corner of the cell, and to the other bit line at a bottom corner of the cell. This alternating arrangement maximizes efficiency, as four cells always share a bit-line contact.

PHYSICAL LAYOUT OF CELL—FIG. 8

Figure 1:
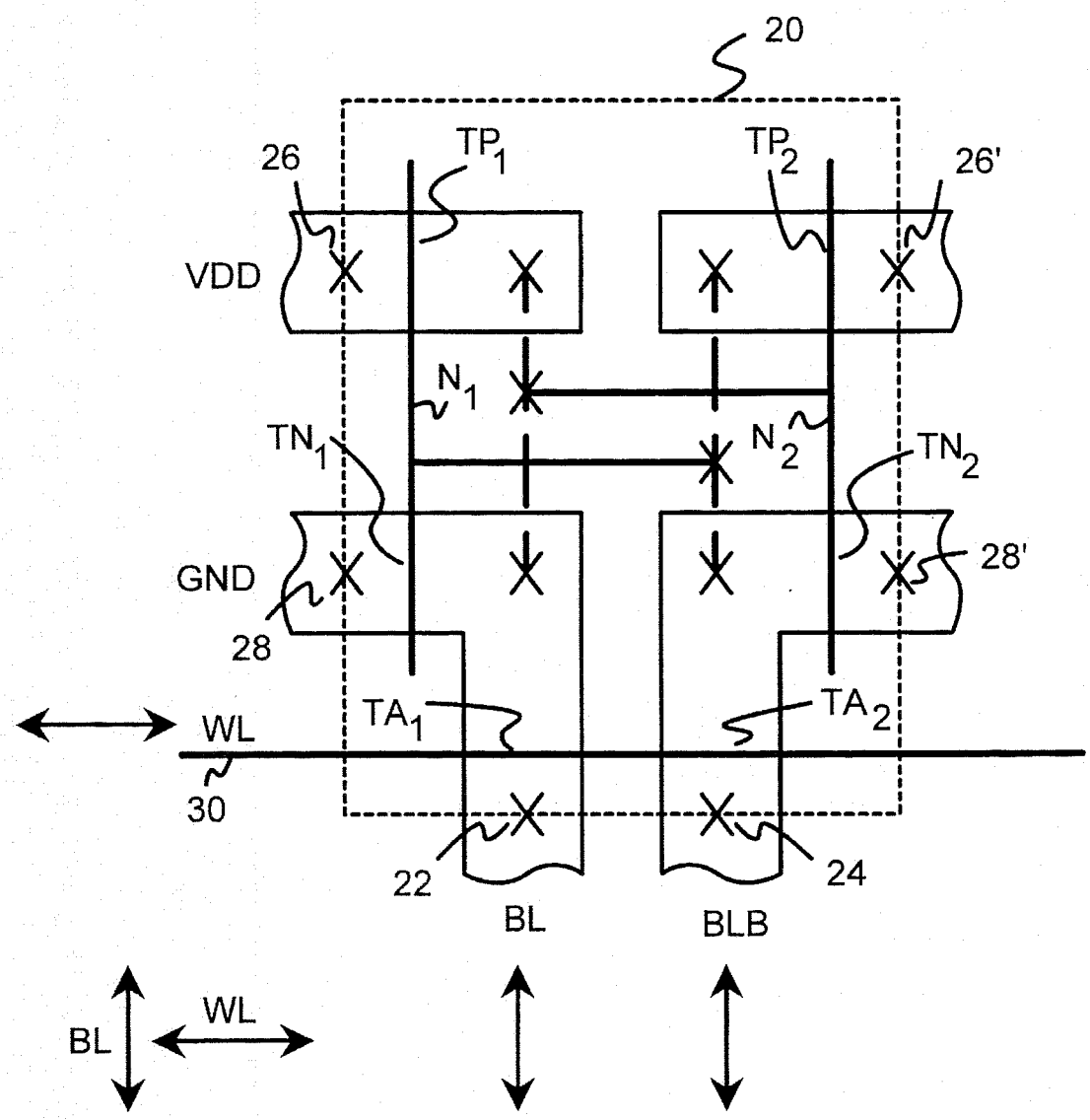
FIG. 1 depicts a SRAM cell layout that is widely used.
Figure 2:
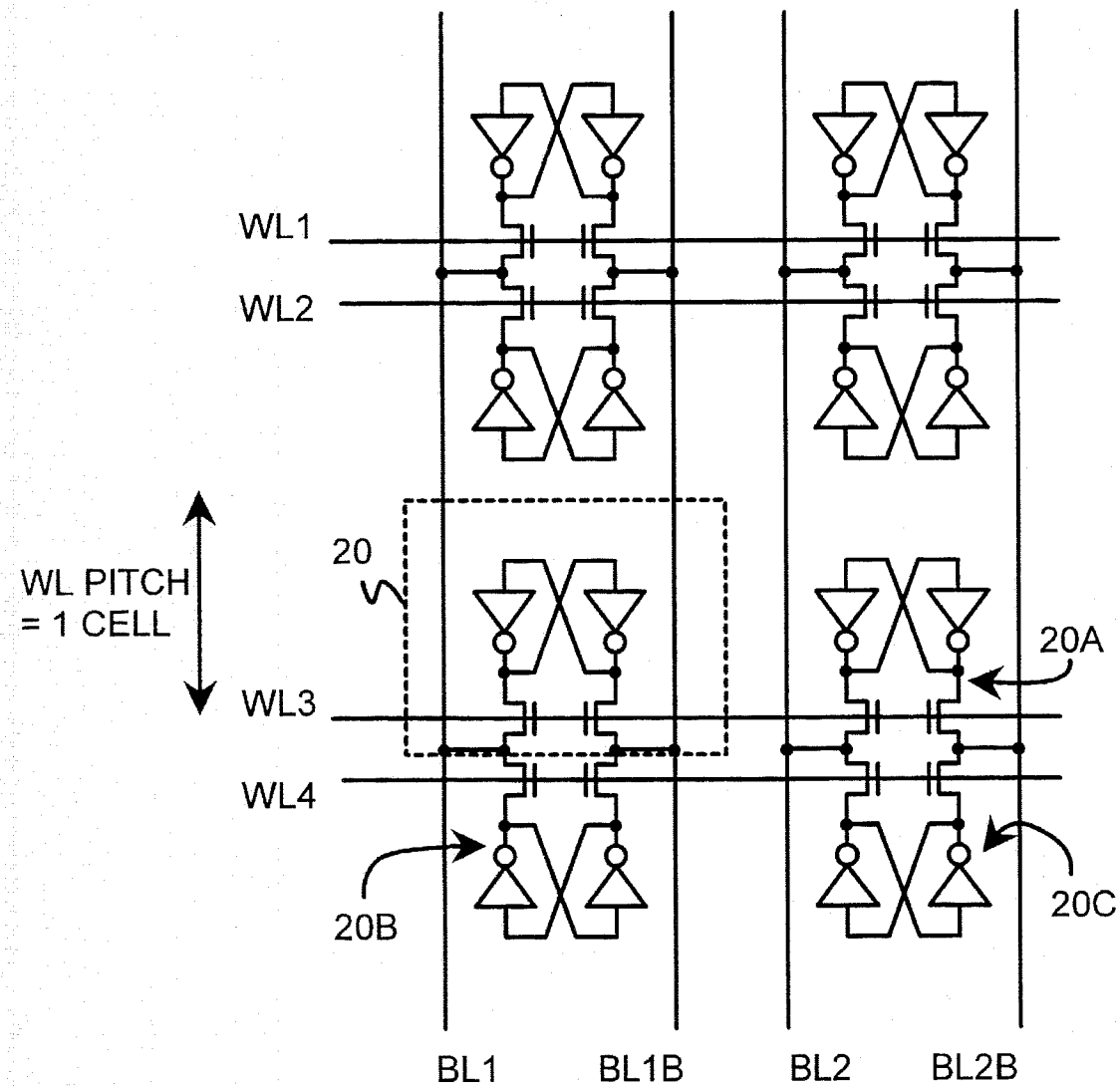
FIG. 2 is a schematic diagram of prior-art memory cell in a small array.
Figure 3:
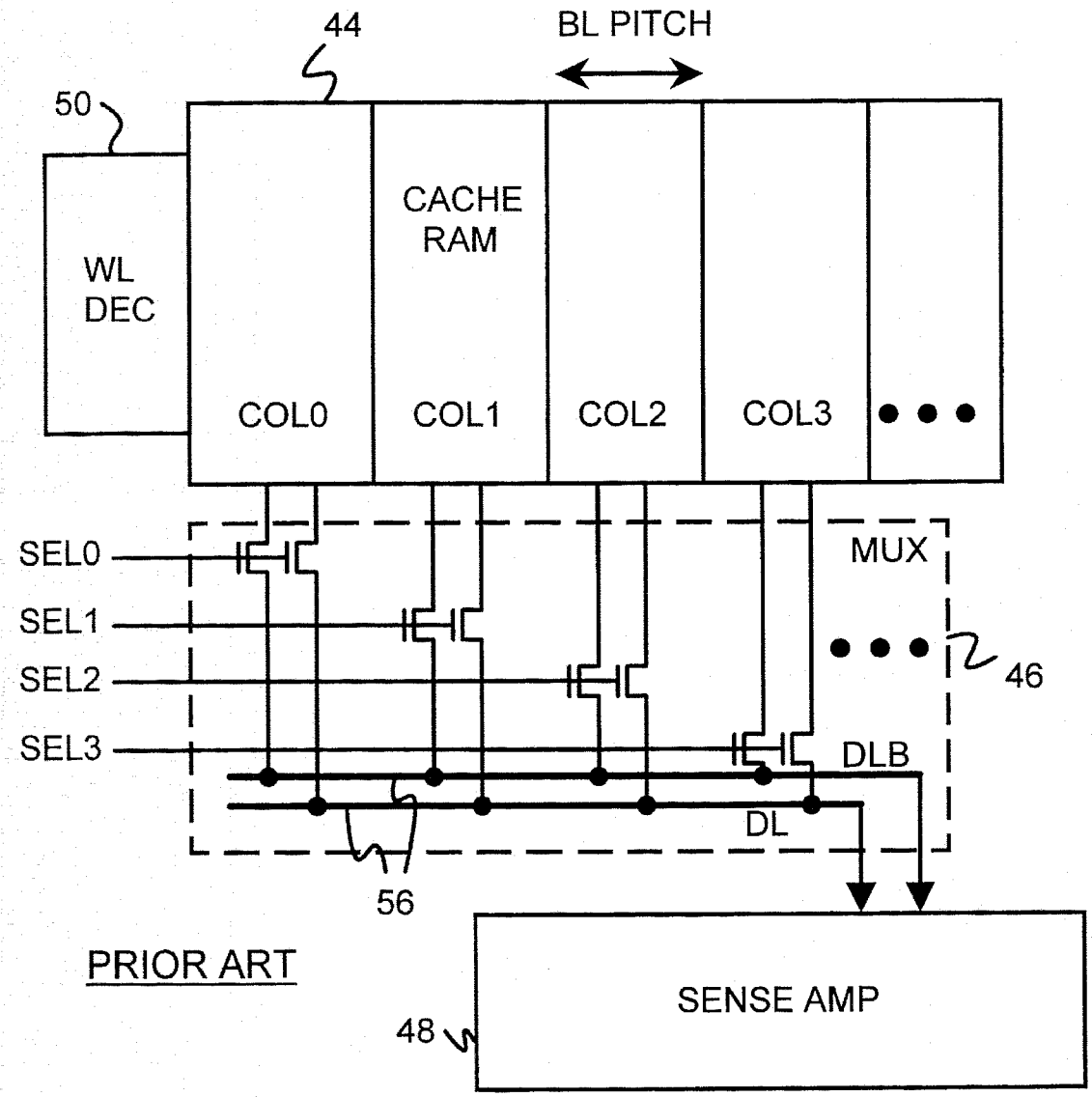
FIG. 3 shows a prior-art memory array which requires muxing to the sense amps because of the small bit-line pitch.
Figure 8:
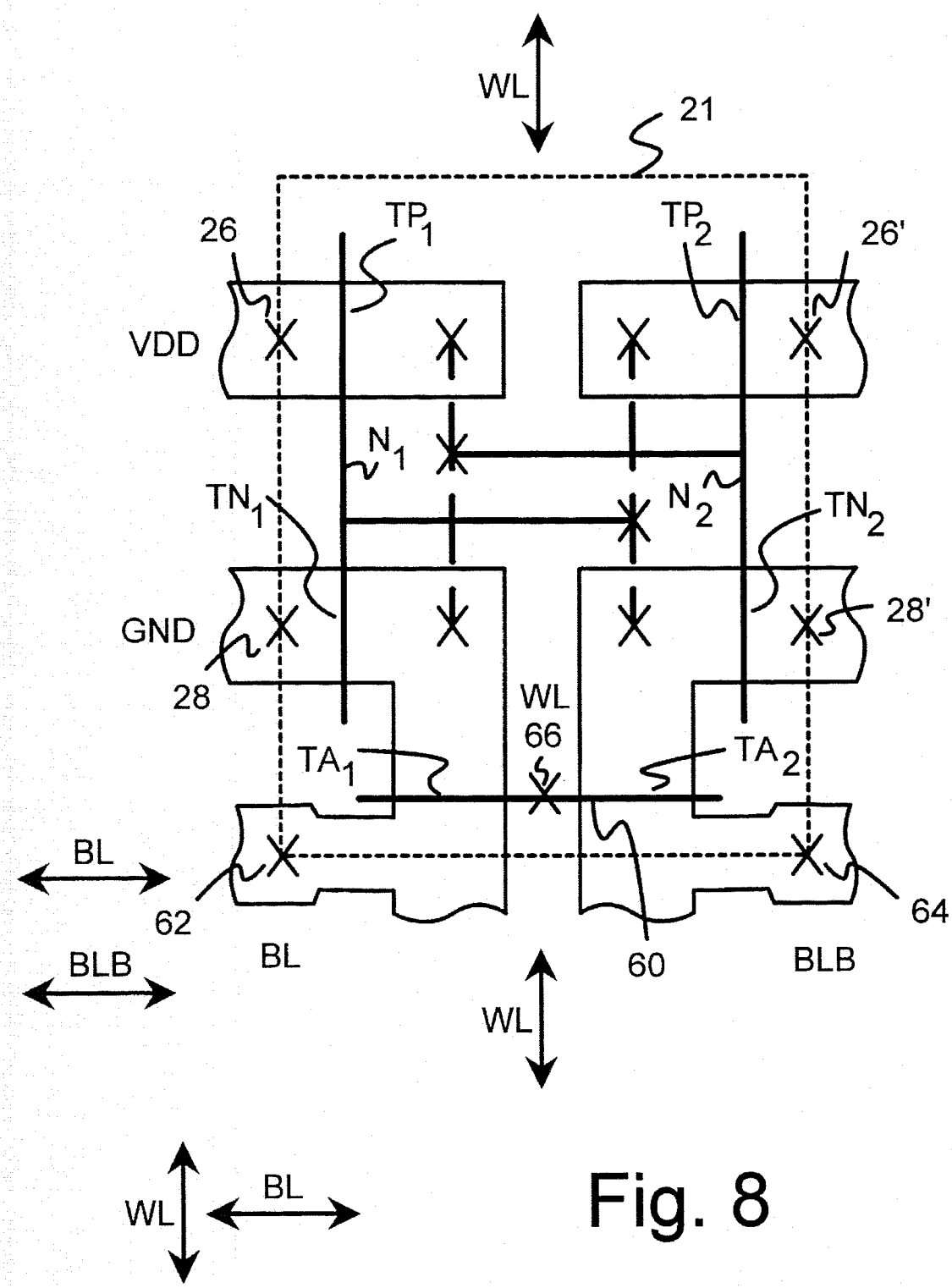
FIG. 8 is a stick diagram of the physical arrangement or layout of the transistors in the SRAM cell with the 4-way shared bit-line contacts.

FIG. 8 is a stick diagram of the physical arrangement or layout of the transistors in the SRAM cell with the 4-way shared bit-line contacts. FIG. 8 shows the memory cell before rotation by ninety degrees so that the orientation of the transistors within the cell is the same orientation as shown for FIG. 1. Thus FIGS. 6 and 7 are rotated by ninety degrees relative to FIG. 8.

FIG. 8 shows the bit lines running in a horizontal or x direction relative to the cell's transistors while the word lines run in a vertical or y direction. Thus the direction of the bit lines and word lines are rotated by ninety degrees relative to the prior-art cell.

Local Connection in Each Cell from Metal Word Lines to Poly Pass Gates

Since the memory cells of the present invention have been substantially rotated by ninety degrees, the access transistors no longer have their polysilicon gates in the same direction as the word lines. Thus the word lines now must run in metal over the cells and connect locally in each cell to the polysilicon gates of the two access transistors.

Word-line contact 66 connects one of the two metal word lines (not shown) running over cell 21 to the local polysilicon line 60. Pass or access transistors $TA_1$ and $TA_2$ are formed when local polysilicon line 60 crosses over the n-channel active areas, which are shared with the n-channel transistors $TN_1$ and $TN_2$. Local polysilicon line 60 is connected by word-line contact 66 within cell 21 to word line WL, which runs in a metal layer such as third-layer metal. Bit-line contacts 62, 64 connect to bit lines BL, BLB, which run in second-layer metal over cell 21 in a horizontal direction as shown. Small tabs of an intermediate metal layer such as first metal may be used to connect to a metal line that is not directly over the contact to active.

The two access n-channel transistors $TA_1$ and $TA_2$ are provided to connect the cross-coupled inverters in cell 21 to a pair of bit lines BL, BLB. When these access transistors $TA_1$ and $TA_2$ conduct, the cell may be read or written to using the bit lines BL, BLB. The width (W) direction of these access transistors is the direction that crosses the active areas at about a perpendicular. This width direction is perpendicular to the direction of the word line, while for the prior-art this width direction was parallel to the word line.

Cross-Coupled Inverters in Cell

The pair of cross-coupled inverters in cell 21 may be laid out in a conventional manner. Cell 21 contains this pair of cross-coupled inverters, each with a p-channel and an n-channel MOS transistor. These transistors are formed where polysilicon, shown as thick lines, cross active areas which are represented as rectangles or polygons. For example, one inverter comprises transistors $TP_1$ and $TN_1$, with transistor $TP_1$ formed when polysilicon line $N_1$ crosses over the p-channel active area containing contact 26 to Vdd, and transistor $TN_1$ formed when polysilicon line $N_1$ crosses over the n-channel active area containing contact 28 to ground. "X"cs represents contacts between layers such as polysilicon, metal, or active silicon. The second inverter comprises transistors $TP_2$ and $TN_2$, with transistor $TP_2$ formed when polysilicon line $N_2$ crosses over the p-channel active area containing contact 26' to Vdd, and transistor $TN_2$ formed when polysilicon line $N_2$ crosses over the n-channel active area containing contact 28' to ground.

Cell 21 has word lines running in a vertical or y-axis direction, while bit lines run in a horizontal or x-axis direction. These directions are the opposite of prior-art cell 20 of FIG. 1. For a three-layer metal process, the first layer of metal is used for interconnect within the cell, for cross-coupling the two inverters, as shown by the dashed thick lines of FIG. 1. The bit lines run in second metal, while the polysilicon word lines run in third-layer metal. It is common to reverse the roles of the second and third layer metals.

Bit-Line Contact Located on Corners of Cells for Sharing 4 Ways

The dotted box of FIG. 8 shows the boundary of cell 21. Since the Vdd and GND contacts 26, 28, 26', 28' fall on this cell boundary, these contacts are shared among two adjacent cells. Bit-line contacts 62, 64 lie on a corner of the cell boundary, and thus are shared among four adjacent memory cells. Thus bit-line contacts are shared among four cells. However, as pointed out in reference to FIG. 7, each bit-line contact 62, 64 is shared among a different group of four cells, as they occur in different corners of cell 21. Bit-line contact 62 to bit line BL is at the lower left corner and thus is shared among the cells below, to the left, and to the diagonal left of cell 21. Bit-line contact 64 to bit line BLB is at the lower right corner and is shared among a different group of four cells—the cells below, to the right, and to the diagonal right of cell 21. Thus a different group of four cells shares each bit-line contact in a alternating arrangement of cells.

FIG. 9 highlights how the bit-line contact is shared among four cells, and that different local polysilicon lines are needed for each cell. Cell 21 is replicated in an array. Bit-line contact 62 is shared among four adjacent cells labeled (1,1), (2,1), (3,1), and (4,1). These cell labels correspond to those for FIGS. 6 and 7, and indicate the word line and bit-line pair the cell is connected to. All four cells connect to the same bit-line pair BL, BLB. Bit-line contact 62 connects all four cells to bit line BL, while bit-line contact 64 connects two of the cells—(1,1) and (2,1) to bit line BLB. Another contact (not shown) on the left edge of cells (3,1) and (4,1) connect these cells to bit line BLB, since the bit-line contacts 62, 64 connect cells to bit lines in an alternating arrangement.

Since the four cells all connect to the same pair of bit lines BL, BLB, a bus conflict would occur if two cells were activated by the same word line. Thus four different word lines WL1, WL2, WL3, WL4 connect to cells labeled (1,1), (2,1), (3,1), (4,1) respectively. Each cell has its own local polysilicon line 60, 60A, 60B, 60C which connect to word lines WL1, WL2, WL3, WL4 through word-line contacts 66, 66A, 66B, 66C respectively. Word lines WL1 and WL2 run in third-layer metal in a vertical direction over cells (1,1) and (2,1), while word lines WL3 and WL4 run in third-layer metal in a vertical direction over cells (3,1) and (4,1). Bit-line contact 62 is located in the source-drain active regions of four access transistors $TA_1$, $TA_1'$, $TA_1''$, $TA_1'''$, for the four cells (1,1), (2,1), (3,1), (4,1).

PHYSICAL LAYOUT—CELL PLOTS

Figure 10A:
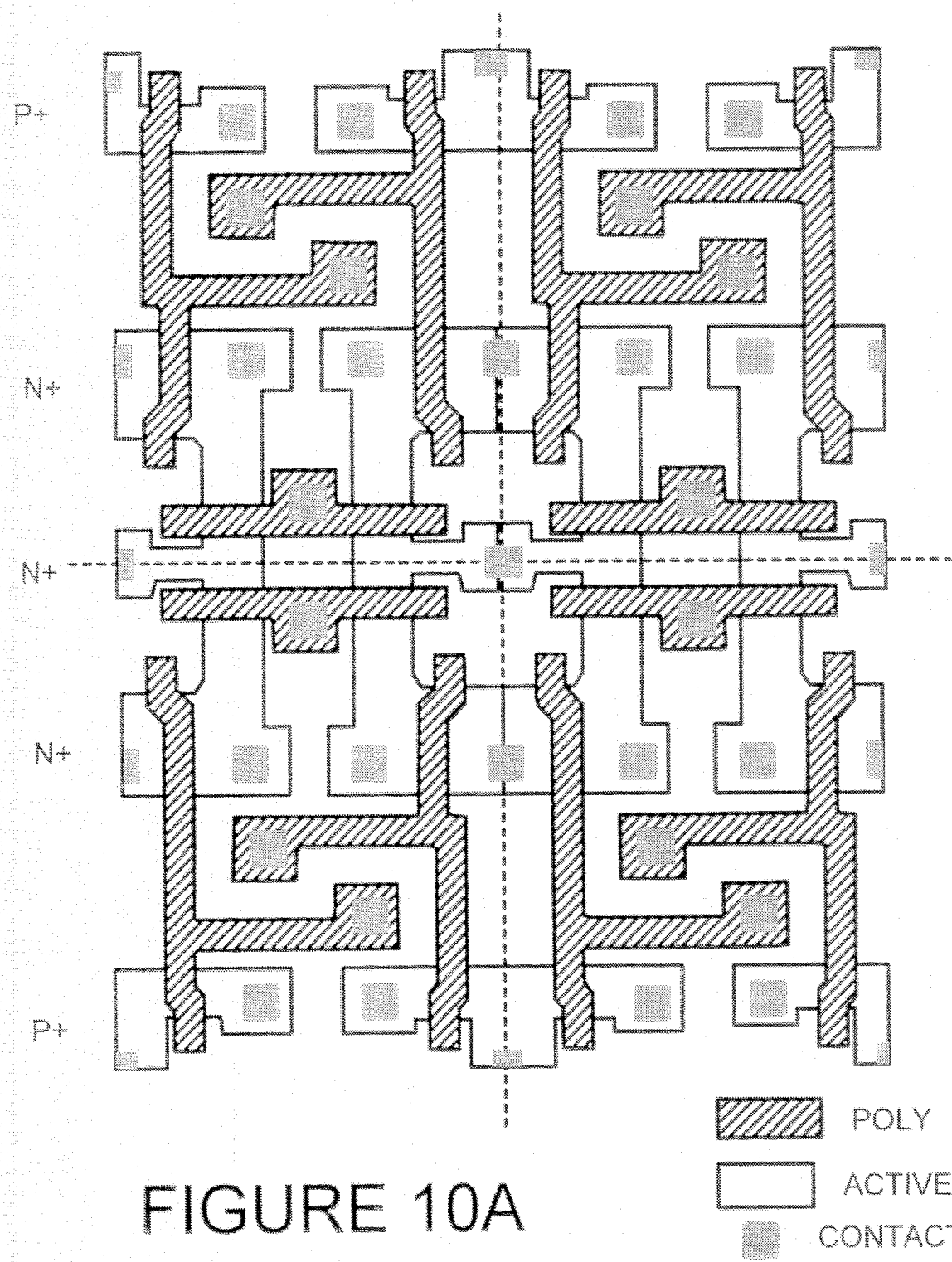
Figure 10B:
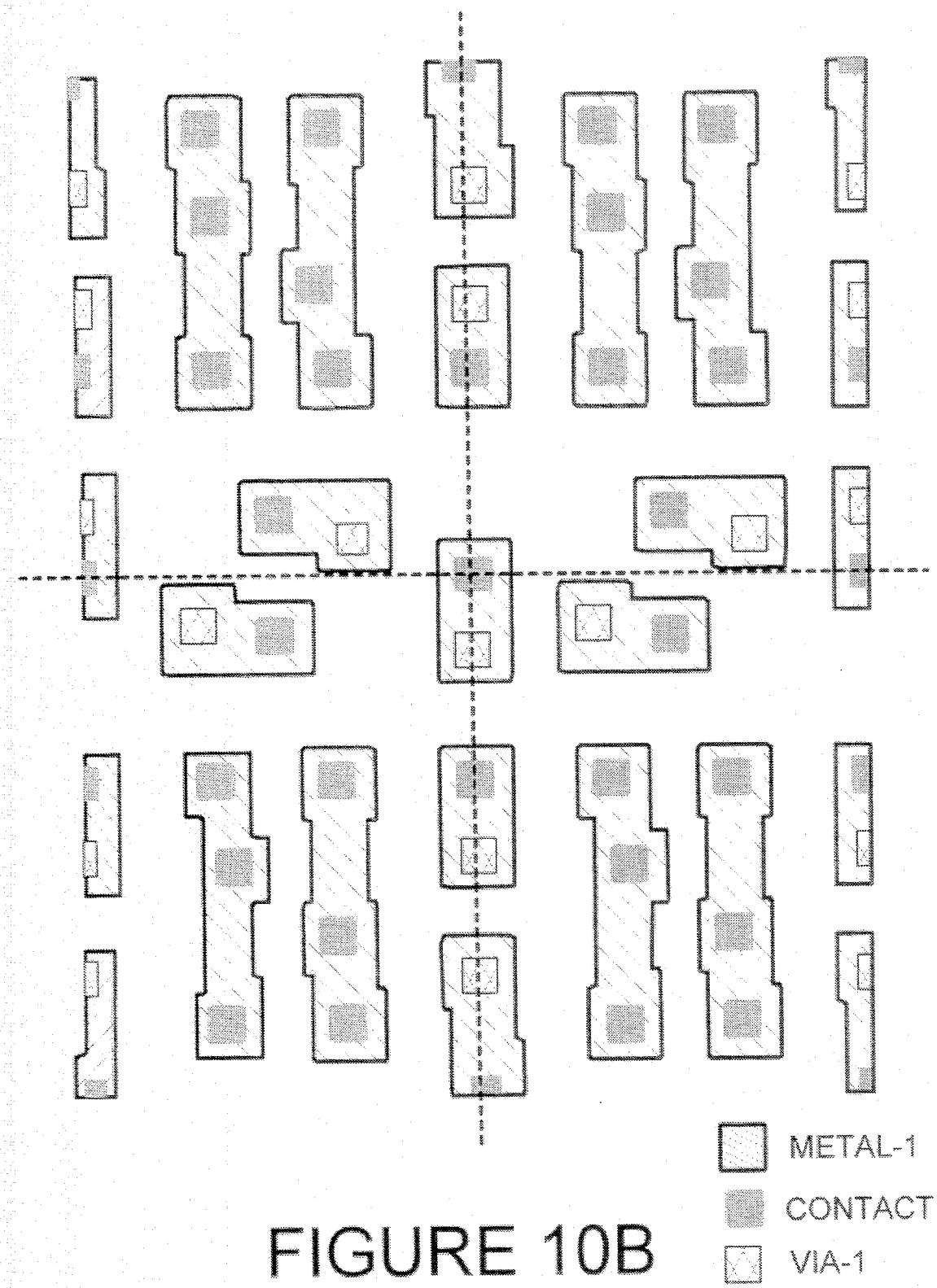

FIGS. 10A, 10B, 10C show the actual layout of four SRAM memory cells with the 4-way shared bit-line contacts for a 1.0 μm CMOS process. Dashed lines show the boundaries between the four cells. FIG. 10A shows the transistor active areas for p-channel and n-channel transistors, and the polysilicon layer which forms the gates of the six transistors in each cell and the local polysilicon word line for the access transistors. The contacts from active or polysilicon to the first-layer metal layer are also shown. The first-layer metal layer is used for local interconnect such as for cross-coupling the inverters. FIG. 10B shows the first-layer metalization, first vias to the second-layer metal, and contacts. The contact in the middle of FIGS. 10B and 10C, at the intersection of the dashed lines indicating the cell boundaries, is the shared bit-line contact that is shared among the four cells. The size of one cell is 11.5 by 15.0 microns.

As the cell is drawn, contacts are 1 square micron while minimum-sized polysilicon gates are also 1 micron in length. This cell, drawn to generic 1.0-micron design rules, may easily be scaled down or adjusted to design rules for any modern process, such as 0.8 or 0.5 micron CMOS processes.

FIG. 10C shows the second and third metal layers, and the second vias which connect these two metal layers. The third-layer metal contains the word lines which run in a vertical direction. The second-layer metal contains the bit lines, power and ground, and an extra line. The second-layer metal generally runs in a horizontal direction.

The third metal layer contains only the two word lines running over each cell:

1. The first word line connects to the local polysilicon line for odd alternate cells.

2. The second word line connects to the local polysilicon line for even alternate cells.

Word lines WL0, WL1 run over the two left cells, while word lines WL2, WL3 run over the right two cells of FIG. 10C. Word line WL0 connects to and controls access to the lower left cell, while WL1 connects to the upper left cell. Word line WL2 connects to the lower right cell and word line WL3 connects to the upper right cell. The contact at the intersection of the four cells of FIGS. 10A–C is the shared contact to bit line BL, while the half-contacts on the left and right sides of the four cells are the shared contacts to bit line BLB.

The second metal layer contains three and one-half channels for signal lines for each cell:

1). Either the true bit line BL, or the complement bit line BLB.

2). Power, Vdd.

3). Ground, GND.

4). Half of an extra, unused metal line XL.

The extra metal line XL is shielded from the bit lines by both the power and the ground lines. When the group of four cells shown is reflected, this half of the extra line abuts to another half of this extra line in the reflected cell, forming a whole extra line for every two columns of memory cells.

The shielding by power and ground occurs in the reflected cells as well as the cells shown in FIGS. 10, providing full shielding on both sides of the extra line. Since power and ground are constant signals that do not have high-frequency signal transitions, power and ground cannot capacitively couple in noise or crosstalk to the extra metal line, and the extra line cannot couple noise into the sensitive bit lines. Shielding the bit lines from external interconnect signals is especially important since external signals usually transition from power to ground, up to a 5-volt swing. However, the bit lines may only swing a few millivolts between logic levels. Thus even if the large voltage swing in the external interconnect signals couples a smaller voltage change into the bit lines, this smaller voltage change may be sufficient to read false data.

This extra line XL is ideal for RAMs that are embedded in a larger system, such as on a processor. Interconnect signals from the system can use these extra lines XL for interconnect of logic blocks on opposite sides of the embedded RAM. FIG. 11 shows an embedded SRAM with extra shielded signal lines that are used for system-level wiring or interconnect. Data Bus 54' may use extra lines XL in cache RAM 44' as a direct path from a block such as BIU 52 on one side of embedded cache RAM 44' to a block on the other side, such as execute core 42. Since the extra lines XL are shielded, crosstalk from data bus 54' to the bit lines or word lines is prevented, even though data bus 54' travels a long distance in parallel with the bit lines in cache RAM 44'. Many interconnect signals may pass through the embedded RAM, since an extra line occurs for every two columns of cells.

Data bus 54' is unrelated to the memory cells in the sense that it may carry data output from the sense amplifiers rather than directly connecting to the word lines or bit lines. The shielding allows any data to be run on data bus 54', whether data to or from the RAM, or system interconnect or control signals.

OTHER ADVANTAGES OF THE INVENTION

Using one bit-line pair for every two columns instead of for every column doubles the bit-line pitch and makes layout of the sense amps directly under the columns possible. This can eliminate the muxing required for prior-art memory arrays with tight bit-line pitch. The shared bit-line contacts help reduce cell area, as the 4-way shared contacts have double the sharing of the prior-art cells. Rotating the cell also frees up a metal line in the bit-line direction for system interconnect when the RAM is embedded in a larger system. Since the bit-line pitch is so much wider, this extra line can fit between power or ground lines which separate and shield the extra line from the bit lines, avoiding problems from capacitive coupling.

The invention also uses less power than the prior art. Since there are two word lines per row of cells instead of one word line per row, only half the number of cells for a given size RAM array are selected with the invention. Halving the number of selected cells means that half the number of bit lines will change or swing in voltage relative to the prior art. The swing in voltage of the bit-lines dissipates power. Thus half the active power is dissipated by the invention.

Since the word lines are usually strapped to metal to reduce resistance, using metal for word lines is not a drawback. Traditionally, word lines have run in polysilicon since older semiconductor processes had just one metal layer. Since the bit lines ran in metal, the word lines had to run in polysilicon for these older single-metal processes. Perhaps this tradition of polysilicon word lines has out-lived its usefulness, although its use is widespread.

ALTERNATE EMBODIMENTS

Several other embodiments are contemplated by the inventor. For example the cross-coupled inverters have been described as having a n-channel pull-down and a p-channel pull-up. However, it is well-known to use a high-resistance device such as a polysilicon load resistor for the pull-up instead of the p-channel transistor. Many other layouts of the cell are possible within the spirit of the invention, and those skilled in the art will be able to make many modifications.

The n-channel access transistor has been described as having a source diffusion connected to the bit line and a drain diffusion connected to the cross-coupled inverters. However, those skilled in the art will recognize that MOS transistors are bi-directional in nature and the source and drain diffusions are physically indistinguishable. For normal bit-line biasing, the source terminal of an n-channel transistor has a lower voltage or potential than the drain terminal, but if the applied voltage is reversed then the source and drain terminals can reverse with the drain becoming the source and vice-versa. Thus the terms "source" and "drain" are used interchangeably.

Many other physical layouts of the cells and variations in it are possible within the spirit of the invention.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An integrated circuit static random-access memory comprising:

a substrate of semiconductor material of a first conductivity type;

an array of memory cells fabricated in the substrate, the cells arranged in rows and columns;

each memory cell in the array of memory cells comprising:

a cross-coupled pair of inverters for storing one bit of data, a first inverter having a first n-channel pull-down transistor and a second inverter having a second n-channel pull-down transistor, each n-channel transistor having a drain diffusion and a gate;

a first access transistor, having a drain diffusion electrically coupled to the drain diffusion of the first n-channel pull-down transistor and electrically coupled to the gate of the second n-channel pull-down transistor of the cross-coupled pair of inverters, the first access transistor having a source diffusion and a gate;

a second access transistor, having a drain diffusion electrically coupled to the drain diffusion of the second n-channel pull-down transistor and electrically coupled to the gate of the first n-channel pull-down transistor of the cross-coupled pair of inverters, the second access transistor having a source diffusion and a gate;

the drain diffusion of the first access transistor being formed in common with the drain diffusion of the first n-channel pull-down transistor, and the drain diffusion of the second access transistor being formed in common with the drain diffusion of the second n-channel pull-down transistor;

the array having a group of four cells of the memory cells disposed in a mutually contiguous relation to each other in a first row and in a second row adjacent to the first row, and in a first column and in a second column adjacent to the first column; and the source diffusions of the first access transistors of each cell in the group of four cells being formed in common in a common diffusion area, the first access transistors of the group of four cells being electrically and physically connected to each other by the common diffusion area and not by a metal layer;

whereby the first access transistor in each cell in the group of four cells shares the common diffusion area.

2. The memory of claim 1 wherein a bit line crosses the group of four cells in a second metal layer, the bit line electrically connecting to the source diffusions of the first access transistors through a single metal-to-silicon contact from the second metal layer to the common diffusion area, wherein only one contact from the bit line to the common diffusion area electrically connects the bit line to four access transistors in four cells.

3. The memory of claim 2 wherein the single metal-to-silicon contact from the second metal layer to the common diffusion area comprises a via from the bit line in the second metal layer to a first metal layer and a contact from the first metal layer to the common diffusion area.

4. The memory of claim 2 wherein the common diffusion area is disposed substantially in a geometric center of the group of four cells.

5. The memory of claim 2 wherein two word lines cross over each cell in each row of cells in the array, each row of cells comprising even cells alternating with odd cells, a first word line connecting to the gates of the first and second access transistors for even cells and a second word line connecting to the gates of the first and second access transistors for odd cells.

6. The memory of claim 5 wherein each cell further comprises:

a local polysilicon line forming the gates of the first and second access transistors in the cell, the local polysilicon line being connected to other cells only by metal and not by polysilicon, the local polysilicon line not being electrically connected to any adjacent cell;

wherein the first and second word lines cross over each cell in a third metal layer, each even cell having a contact from the first word line in third metal layer to the local polysilicon line, and each odd cell having a contact from the second word line in third metal layer to the local polysilicon line.

7. The memory of claim 6 wherein the third metal layer is disposed above the second metal layer, the third metal layer crossing each row of cells in a direction substantially parallel to the rows but substantially perpendicular to the columns of cells and the bit line in the second metal layer.

8. The memory of claim 6 wherein the array has two word lines for each row of cells but one pair of bit lines for each pair of columns, the group of four cells having four word lines which select no more than one of the four cells for access to the pair of bit lines, the pair of bit lines including the bit line connected to the first access transistors by the common diffusion area in a center of the four cells and a complementary bit line connected to the source diffusion of the second access transistors.

9. The memory of claim 8 wherein the complementary bit line is connected to the second access transistors by two additional common diffusion areas at a top edge and a bottom edge of the group of four cells, the additional common diffusion area at the top edge of the group of four cells being shared with two upper cells in the group of four cells and two cells in an upper adjacent group of four cells abutting the group of four cells at the top edge, while the additional common diffusion area at the bottom edge of the group of four cells being shared with two lower cells in the group of four cells and two cells in a lower adjacent group of four cells abutting the group of four cells at the bottom edge, wherein the bit line is connected to the group of four cells in the center of the group of four cells but the complementary bit line is connected to the group of four cells at the top and bottom edges of the group of four cells.

10. A memory comprising:

a plurality of memory cells arranged in an array of rows and columns, a row and a column intersecting at a single cell, the columns being further arranged into non-overlapping column-pairs each consisting of two adjacent columns;

a first and a second word line for each row of memory cells, the first word line selecting a first plurality of memory cells in the row and the second word line selecting a second plurality of memory cells in the row, each memory cell in the first plurality of cells being adjacent on both sides to memory cells in the second plurality of cells in an alternating sequence memory cells in the row of memory cells;

a pair of bit lines for every column-pair of memory cells, the pair of bit lines including a true bit line and a complement bit line together communicating one bit of data;

each cell in the plurality of memory cells comprising: storage means for storing one bit of data; first access transistor means for coupling the storage means to the true bit line; and second access transistor means for coupling the storage means to the complement bit line;

the first and the second access transistor means having control gates coupled to a local word line for the cell, the local word line being coupled to the first word line when the cell is in the first plurality of cells but coupled to the second word line when the cell is in the second plurality of cells;

whereby each memory cell connects to one of the two word lines crossing the cell and one pair of bit lines connects to two columns of cells.

11. The memory of claim 10 further comprising:

a four-way shared active region on a substrate, the four-way shared active region being a source terminal of the first access transistor means for each of four memory cells in two adjacent rows and a column-pair of memory cells, the four-way shared active region being electrically connected to the true bit line for the column-pair by a shared contact;

wherein a single active region with one shared contact connects the true bit line to four cells.

12. The memory of claim 11 wherein four memory cells in the two adjacent rows and the column-pair of memory cells comprise a first quad of cells, the memory further comprising:

a second quad adjacent to and above the first quad of cells and being in the column-pair of memory cells containing the first quad, the second quad containing four cells;

a second four-way shared active region disposed between the first and second quad of cells, the second shared active region being a source terminal of the second access transistor means for (i) two upper cells in the first quad, and (ii) two lower cells in the second quad, the two upper cells and the two lower cells being adjacent;

the second four-way shared active region being electrically connected to the complement bit line for the column-pair by a second shared contact;

wherein a single active region with one shared contact connects the complement bit line to four cells.

13. The memory of claim 12 wherein each column-pair comprises a plurality of non-overlapping contiguous quads of four cells, with the four-way shared active region disposed substantially near the middle of the four cells in each of the quads, and with the second four-way shared active region disposed substantially between adjacent quads, wherein the true bit line for the column-pair connects to the access transistor means for each cell in each quad through the shared contacts near the middle of the four cells in each of the quads, while the complement bit line for the column-pair connects to the access transistor means for each cell in each quad through the second shared contacts between adjacent quads.

14. The memory of claim 13 wherein the pitch between the true bit lines for the column-pairs is larger than the pitch between the word lines for the rows.

15. The memory of claim 13 wherein each cell further comprises:

two third-layer metal channels for the first and second word lines for connecting the word lines in adjacent cells in a row; and a second-layer metal channel for the true bit line when the cell is in the first plurality of cells or for the complement bit line when the cell is in the second plurality of cells.

16. The memory of claim 15 wherein the memory is embedded in a system, and wherein each cell further comprises:

a second-layer metal channel for ground, coupled to the storage means;

a second-layer metal channel for power, coupled to the storage means; and half of an extra second-layer metal channel for the system for system interconnect unrelated to the memory cells, the half of the extra second-layer metal channel being electrically shielded from the true and complement bit lines by the second-layer metal channels for power and for ground.

17. The memory of claim 16 wherein the second-layer metal channels are situated above the third-layer metal channels.

18. The memory of claim 13 wherein the access transistor means comprises an n-channel MOS transistor and wherein the storage means comprises a pair of cross-coupled inverters.

19. The memory of claim 18 wherein the pair of cross-coupled inverters each comprise a n-channel MOS transistor and a p-channel MOS transistor having their gates coupled together and having their drains coupled together.

20. The memory of claim 19 wherein the access transistor means have the width direction of their gates in substantially the same direction as the columns and bit lines, and wherein the word lines are substantially perpendicular to the direction of the gates of the access transistor means.

* * * * *